United States Patent
Tanpairoj et al.

(10) Patent No.: US 11,348,636 B2
(45) Date of Patent: *May 31, 2022

(54) ON-DEMAND HIGH PERFORMANCE MODE FOR MEMORY WRITE COMMANDS

(71) Applicant: Micron Technology, Inc., Boise, ID (US)

(72) Inventors: Kulachet Tanpairoj, Santa Clara, CA (US); Jianmin Huang, San Carlos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/302,282

(22) Filed: Apr. 29, 2021

(65) Prior Publication Data

US 2021/0249071 A1    Aug. 12, 2021

Related U.S. Application Data

(63) Continuation of application No. 16/529,565, filed on Aug. 1, 2019, now Pat. No. 11,017,847.

(51) Int. Cl.
*G11C 11/00* (2006.01)
*G11C 11/419* (2006.01)
*G11C 11/408* (2006.01)
*G11C 11/4076* (2006.01)

(52) U.S. Cl.
CPC ........ *G11C 11/419* (2013.01); *G11C 11/4076* (2013.01); *G11C 11/4082* (2013.01); *G11C 2207/229* (2013.01); *G11C 2207/2281* (2013.01)

(58) Field of Classification Search
CPC .............. G11C 11/419; G11C 11/4076; G11C 11/4082; G11C 2207/2281
See application file for complete search history.

(56) References Cited

U.S. PATENT DOCUMENTS

| | | | | |
|---|---|---|---|---|
| 8,738,840 B2* | 5/2014 | Tzeng | ................. | G06F 12/0246 |
| | | | | 711/103 |
| 9,201,595 B2* | 12/2015 | Lee | ....................... | G11C 7/1006 |
| 9,330,735 B2 | 5/2016 | Harris et al. | | |
| 10,372,351 B2* | 8/2019 | Frid | ....................... | G06F 3/0656 |
| 11,017,847 B2* | 5/2021 | Tanpairoj | ............ | G11C 11/4076 |

* cited by examiner

*Primary Examiner* — Pho M Luu
(74) *Attorney, Agent, or Firm* — Lowenstein Sandler LLP

(57) ABSTRACT

A processing device in a memory system determines whether a number of pending memory commands satisfies a threshold criterion. Responsive to the number of pending memory commands satisfying the threshold criterion, the processing device initiates a first mode of operation for the system and writes, in the first mode of operation, data corresponding to at least a subset of the number of pending memory commands to a first portion of the memory device.

20 Claims, 5 Drawing Sheets

ON-DEMAND HIGH PERFORMANCE MODE FOR MEMORY WRITE COMMANDS

RELATED APPLICATIONS

This application is a continuation of U.S. patent application Ser. No. 16/529,565, filed Aug. 1, 2019, now U.S. Pat. No. 11,017,847, issued May 25, 2021, the entire contents of which are hereby incorporated by reference herein.

TECHNICAL FIELD

Embodiments of the disclosure relate generally to memory sub-systems, and more specifically, relate to an on-demand high performance mode for memory write commands.

BACKGROUND

A memory sub-system can be a storage system, a memory module, or a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
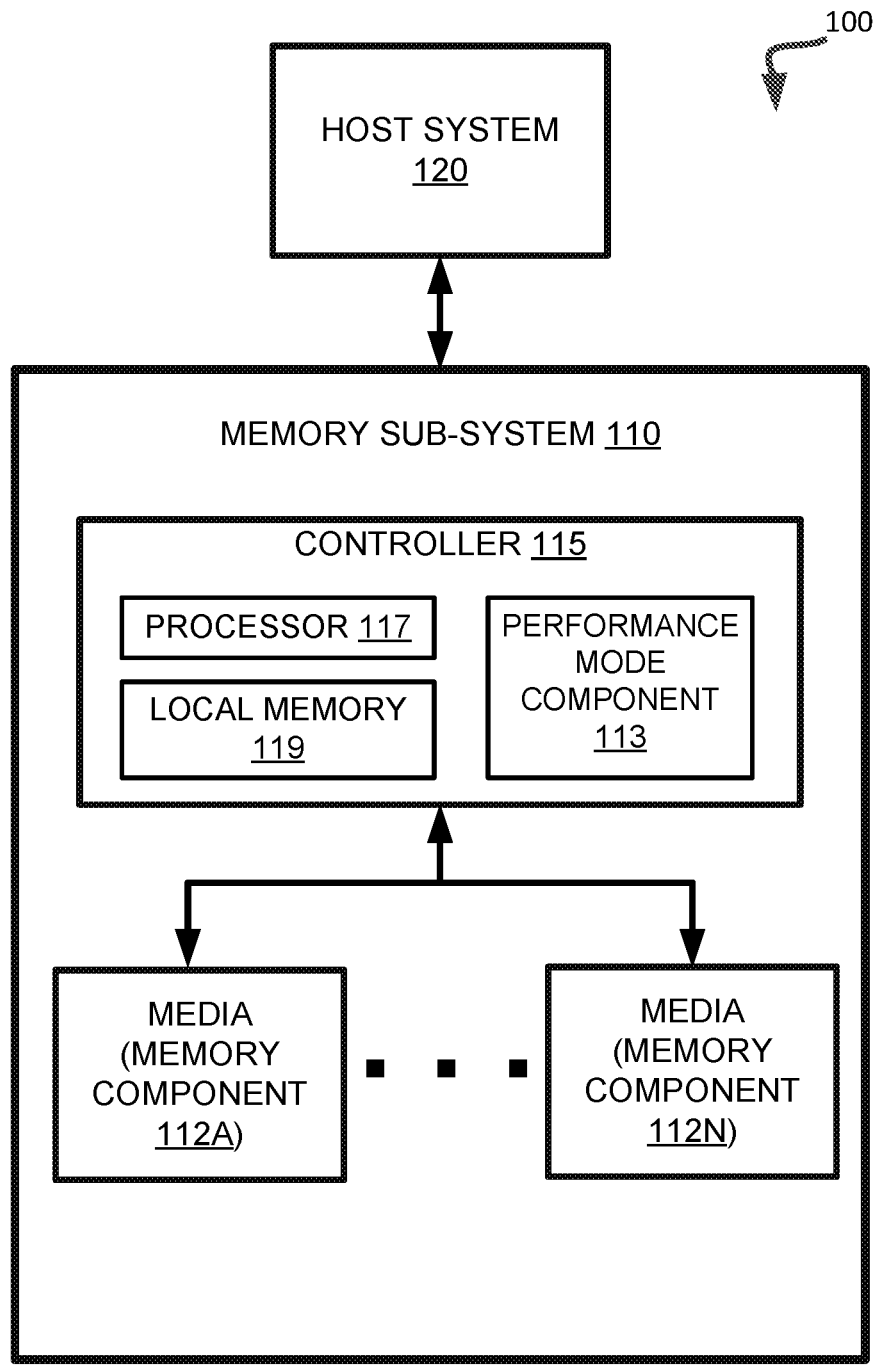
FIG. 1 illustrates an example computing environment that includes a memory sub-system in accordance with some embodiments of the present disclosure.

Aspects of the present disclosure are directed to an on-demand high performance mode for memory write commands in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components. The host system can provide data to be stored at the memory sub-system and can request data to be retrieved from the memory sub-system.

Memory systems in today's varied computing environments are often specialized to emphasize particular features. For example, in certain environments, such as those for mobile computing systems, performance, network activity, and battery usage may be prioritized as compared to non-mobile computing systems. Storage capacity, however, may not be as important since, due to network connectivity providing the ability to transfer data elsewhere, remote storage is available which may be of significantly larger capacity than that available locally. As such, in these certain environments, the local storage may be used to store data only temporarily before it can be transferred to remote storage. With increasing network bandwidths, large amounts of data may be written to the local memory storage. As such, system performance can be a critical requirement for these systems.

Data blocks in a memory system are formed from a number of memory cells. Each of the memory cells can store one or more bits of binary data corresponding to the data received from a host system. In one example, a block of the memory system can be configured as single-level-cell (SLC) memory where each memory cell of the SLC memory can be programmed with a single bit of data. When storing one bit of data in the SLC memory, a range of possible voltage levels of a memory cell is divided into two ranges. For example, the two ranges can include a first threshold voltage range that corresponds to the logical data value "1" and a second threshold voltage range that corresponds to the logical data value "0."

Other data blocks in the memory system can be configured as higher density memory, such as multi-level cell (MLC) memory that is programed by storing two bits per memory cell, three bits per memory cell, four bits per memory cell, or more bits per memory cell. Data can be stored at an MLC memory based on a total voltage range that is divided into some number of distinct threshold voltage ranges for the memory cells. Each distinct threshold voltage range corresponds to a predetermined value for the data stored at the memory cell. For example, some MLC cells can store two bits of data, others referred to triple-level cell (TLC) memory can store three bits of data, while still others referred to as quad-level cell (QLC) memory can store four bits of data. As used herein the term "multi-level cell memory" can include any memory configured to store more than one bit of data per cell.

Despite the smaller capacity of SLC memory, it still has many benefits including superior performance and reliability compared to MLC/TLC/QLC memory. Thus, certain conventional systems configure a fixed portion of the memory as SLC memory (i.e., an SLC cache). These systems operate by initially writing all data associated with any memory write commands received from the host system to data blocks configured as SLC memory and later migrate that data to MLC/TLC/QLC memory. The performance benefits of using SLC memory in this manner, however, are offset by an increase in program and erase (P/E) cycles, since three SLC cells are written and erased once that data is migrated to one TLC cell for example, leading to a decrease in endurance for the memory device. In addition, the static size of the SLC cache increases the die size of the memory device leading to increased cost, and reduces the capacity of the device. Furthermore, in performance-centric systems, writing host data directly to MLC/TLC/QLC memory may often be too slow and doing so will not meet customer performance requirements.

Aspects of the disclosure address the above and other deficiencies by implementing an on-demand high performance mode for memory write commands in a memory sub-system. The workload in many computing systems varies over time. Thus, there will be certain periods when the host system requires higher performance from the memory sub-system and other times when that performance is not as critical. Accordingly, it would be beneficial to write to SLC memory, thereby obtaining faster write times, only when the system requires the higher performance offered by the SLC memory, and otherwise write directly to MLC/TLC/QLC memory. In one implementation, the performance requirements of the host system can be represented by the queue depth of an incoming write command queue for the memory sub-system. Thus, a performance mode component of the memory sub-system can determine whether a number of memory write commands stored in the queue satisfies a queue depth threshold criterion (e.g., exceeds a certain queue depth threshold number). Responsive to the queue depth threshold criterion being satisfied, the performance mode component initiates a high performance mode of operation for the system where, when memory commands are executed in the high performance mode of operation, data associated with the memory commands is written to SLC memory. At other times when the number of memory write commands stored in the queue does not satisfy the queue depth threshold criterion (e.g., is below a certain number), the performance mode component initiates a standard performance mode of operation for the system where, when memory commands are executed in the standard performance mode of operation, data associated with the memory commands is written to MLC/TLC/QLC memory.

This on-demand use of the high performance mode offers a number of advantages compared to conventional memory write techniques. Writing to SLC memory only when the performance requirements of the host system dictate to do so reduces the write amplification impact associated with writing all data to SLC memory and later migrating that data to MLC/TLC/QLC memory. This improves the endurance of the memory device and reduces the defectively rate for blocks on the device. Furthermore, the high performance mode increase write performance by reducing the write times during periods of increased host activity.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data. The data blocks can be further grouped into one or more planes on each of memory components 112A to 112N, where operations can be performed on each of the planes concurrently. Corresponding data blocks from different planes can be associated with one another in a stripe than spans across multiple planes.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a performance mode component 113 used to implement an on-demand high performance mode for memory write commands received from host system 120 and associated with data to be written to one of memory components 112A to 112N. In one implementation, performance mode component 113 can initiate either a high performance mode or a standard performance mode in memory sub-system 110, or cause memory sub-system 110 to switch from one performance mode to the other. Performance mode component 113 may set the performance mode based on the performance requirements of host system 120. Performance mode component 113 interprets a large number of memory write commands received from host system 120 over a relatively short period of time as an indication to that the performance requirements of host system 120 are high. Thus, performance mode component 113 can monitor the queue depth of a memory write command queue in controller 115 (i.e., the number of pending memory write commands in the queue). In one implementation, the memory write command queue is implemented in local memory 119. Performance mode component 113 can determine whether a number of memory write commands stored in the queue satisfies a queue depth threshold criterion (e.g., exceeds a programmable threshold number). If the number of memory write commands stored in the queue does not satisfy the queue depth threshold criterion (e.g., is equal to or below the threshold number depending on the implementation), the performance mode component initiates a standard performance mode of operation for memory sub-system 110 where, when memory write commands are executed in the standard performance mode of operation, data associated with the memory write commands is written to data blocks of memory components 112A to 112N configured as MLC/TLC/QLC memory.

Responsive to the queue depth threshold criterion being satisfied (e.g., is equal to or above the threshold number depending on the implementation), however, performance mode component 113 initiates a high performance mode of operation for the memory sub-system 110. When memory write commands are executed in the high performance mode of operation, data associated with the memory write commands is written to data blocks of memory components 112A to 112N configured as SLC memory. Upon performance mode component 113 determining that host system 120 is idle (i.e., determining that all of the memory write commands in the queue have been executed and that the queue has been empty for a threshold period of time), performance mode component 113 can migrate the data written to data blocks configured as SLC memory to other data blocks of the memory components 112A to 112N configured as MLC/TLC/QLC memory. Further details with regards to the operations of performance mode component 113 are described below.

Figure 2:
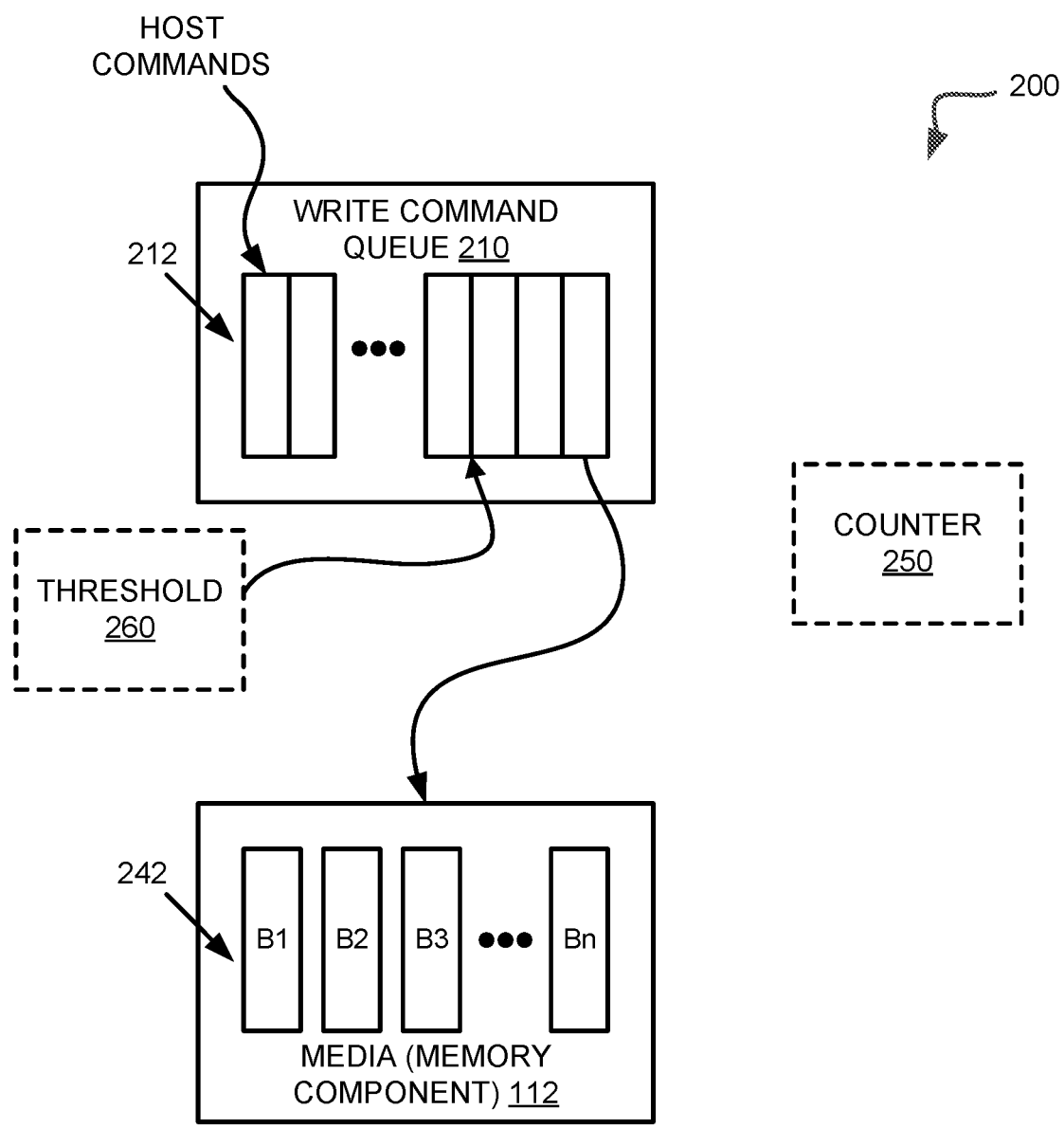
FIG. 2 is a block diagram of queue structure for processing memory write commands using an on-demand high performance mode in accordance with some embodiments of the present disclosure.

FIG. 2 is a block diagram of queue structure 200 for processing memory write commands using an on-demand high performance mode in accordance with some embodiments of the present disclosure. In one implementation, the queue structure 200 includes write command queue 210. In other implementations, queue structure 200 may include some other number and/or arrangement of queues, such as a general command queue in which all commands received from host system 120 are initially stored and/or a write command queue. As described above, queue structure 200, including write command queue 210, may be implemented in local memory 119 of controller 115 in memory sub-system 110. Write command queue 210 may include a collection of write commands that are kept in order, such that the first command enqueued in (i.e., added to) queue 210 is also the first command to be dequeued (i.e. removed)

from queue 210. In other implementations, some other data structure or structures may be used, such as a buffer, etc.

Write command queue 210 receives host write commands 212 from host system 120, or from some other component of memory sub-system 110, and stores the host write commands 212 until further processing can be performed. Each host write command 212 includes instructions to write data to a particular address of the memory component 212. In one implementation, memory component 112 is a single memory die including a number of separate data blocks 242. Host write commands 212 from write command queue 210 can be directed to any of data blocks 242. Certain data blocks can be configured at SLC memory (e.g., B1) while other data blocks are configured as MLC/TLC/QLC memory (e.g., B2). In another implementation, memory component 112 includes multiple memory die. In one implementation, memory sub-system 110 includes a separate queue structure 200 for each memory component 112 or for each individual memory die of a memory component.

In one implementation, performance mode component 113 can monitor the queue depth of write command queue 210 over time. Performance mode component 113 can determine whether a number of host write commands 212 stored in the write command queue 210 satisfies a queue depth threshold criterion pertaining to a threshold number of queue entries 260 (e.g., host write commands). In one implementation, each time a new command is received from host system 120, performance mode component 113 determines the number of host write commands 212 in write command queue 210 and compares the number of host write commands 212 to the threshold 260. In one implementation, performance mode component 113 periodically compares the number of host write commands 212 in write command queue 210 to threshold 260 without regard to whether a new host command has been received. In one implementation, performance mode component 113 determines that the queue depth threshold criterion is satisfied when the number of host write commands 212 in write command queue 210 meets or exceeds threshold 260. In another implementation, performance mode component 113 determines that the queue depth threshold criterion is satisfied when the number of host write commands 212 in write command queue 210 exceeds threshold 260. Threshold 260 can be a dynamically configurable parameter defined either by a discrete number of host write commands 212 in write command queue 210 or as a percentage of the total capacity of write command queue 210. For example, threshold 260 can be set at two commands, three commands, four commands, etc., or as write command queue 210 being 5% full, 10% full, 15% full, etc. In one implementation, threshold 260 can be dynamically adjusted in response to the remaining capacity of memory component 112. For example, as the remaining capacity of memory component 112 decreases, performance mode component can increase threshold 260, such that more host write commands 212 would have to be received and stored in write command queue 210 before the queue depth threshold criterion is satisfied. In other implementations, other factors can influence the value of threshold 260.

Responsive to the queue depth threshold criterion not being satisfied, performance mode component 113 initiates a standard performance mode of operation for memory sub-system 110. When host write commands 212 are executed in the standard performance mode of operation, performance mode component 113 writes data associated with the host write commands 212 to data blocks of memory component 112 configured as MLC/TLC/QLC memory (e.g., B2). Responsive to the queue depth threshold criterion being satisfied, however, performance mode component 113 initiates a high performance mode of operation for the memory sub-system 110. When host write commands 212 are executed in the high performance mode of operation, performance mode component 113 writes data associated with the host write commands 212 to data blocks of memory component configured as SLC memory (e.g., B1). Upon performance mode component 113 determining that host system 120 is idle (i.e., upon determining that all of the host write commands 212 in write command queue 210 have been executed and that the write command queue 210 has been empty for a threshold period of time as measured by counter/timer 250), performance mode component 113 can migrate the data written to data blocks of memory component 112 configured as SLC memory (e.g., B1) to other data blocks of memory component 112 configured as MLC/TLC/QLC memory (e.g., B2).

As described above, some MLC cells can store two bits of data, TLC cells can store three bits of data, and QLC cells can store four bits of data. For example, in a QLC memory, a memory cell can store four bits of data (e.g., 1111, 0000, 1101, etc.) corresponding to data received from the host system 120. In QLC memory, each bit of the memory cell is stored at a different portion (also referred to as a "page" hereafter) of the memory cell. A memory cell of the QLC memory can have a total of four pages. For example, the memory cell can include a lower page (LP), an upper page (UP), an extra page (XP) and a top page (TP), where each page stores a bit of data. For example, a bit can be represented by each of the four pages of the memory cell. In a memory cell for a QLC memory, each combination of four bits can correspond to a different threshold voltage range (also referred to as a "level" hereafter). For example, a first level of the memory cell can correspond to 1111, a second level can correspond to 0111, and so on. Because a memory cell for a QLC memory includes four bits of data, there are a total of 16 possible combinations of the four bits of data. Accordingly, a memory cell for a QLC memory can be programmed to one of 16 different levels.

Figure 3:
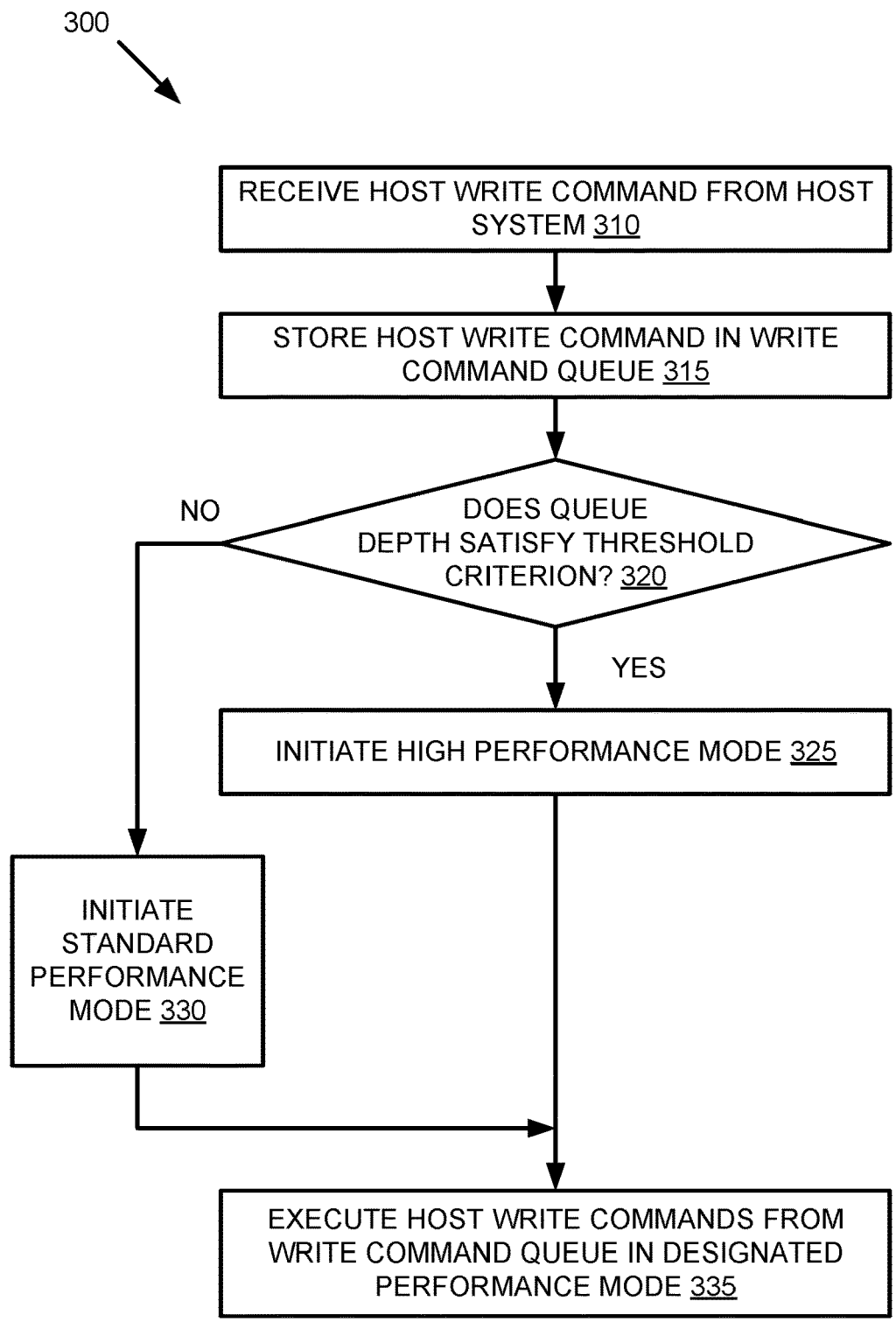
FIG. 3 is a flow diagram of an example method for processing memory commands using an on-demand high performance mode in accordance with some embodiments of the present disclosure.

FIG. 3 is a flow diagram of an example method for processing memory commands using an on-demand high performance mode in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by performance mode component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing device receives a host write command 212 from the host system 120 or from some other component of memory sub-system 110. At operation 315, the processing device stores the host write command 212 in write command queue 210. Write command queue 210 may include a collection of host write commands 212 that are kept in order, and implements a first-in-first-out (FIFO) scheme for management of the host write commands 212. In other implementations, some other data structure or structures may be used, such as a buffer, etc.

At operation 320, the processing device determines whether the number of host write commands 212 stored in write command queue 210 (i.e., the queue depth) satisfies a queue depth threshold criterion. In one implementation, performance mode component 113 determines a number of host write commands 212 stored in write command queue 210 at a certain point in time (e.g., when a new host write command 212 is received at block 305) and compares the number of host write commands 212 to a threshold number of queue entries 260. In one implementation, performance mode component 113 determines that the queue depth threshold criterion is satisfied when the number of host write commands 212 in write command queue 210 meets or exceeds threshold 260 and that the queue depth threshold criterion is not satisfied when the number of host write commands 212 in write command queue 210 is below threshold 260.

If the number of host write commands 212 stored in write command queue 210 satisfies the queue depth threshold criterion, at operation 325, the processing device initiates a high performance mode of operation for the memory sub-system 110. If the number of host write commands 212 stored in write command queue 210 does not satisfy the queue depth threshold criterion, at operation 330, the processing device initiates a standard performance mode of operation for memory sub-system 110.

At operation 335, the processing device executes host write commands 212 from write command queue 210 in the designated performance mode (i.e., high performance mode or standard performance mode. When host write commands 212 are executed in the high performance mode of operation, performance mode component 113 writes data associated with the host write commands 212 to data blocks of memory component 112 configured as SLC memory (e.g., B1). When host write commands 212 are executed in the standard performance mode of operation, performance mode component 113 writes data associated with the host write commands 212 to data blocks of memory component 112 configured as MLC/TLC/QLC memory (e.g., B2).

Upon performance mode component 113 determining that host system 120 is idle (i.e., upon determining that all of the host write commands 212 in write command queue 210 have been executed and that the write command queue 210 has been empty for a threshold period of time), performance mode component 113 can migrate the data written to data blocks of memory component 112 configured as SLC memory (e.g., B1) to other data blocks of memory component 112 configured as MLC/TLC/QLC memory (e.g., B2).

Figure 4:
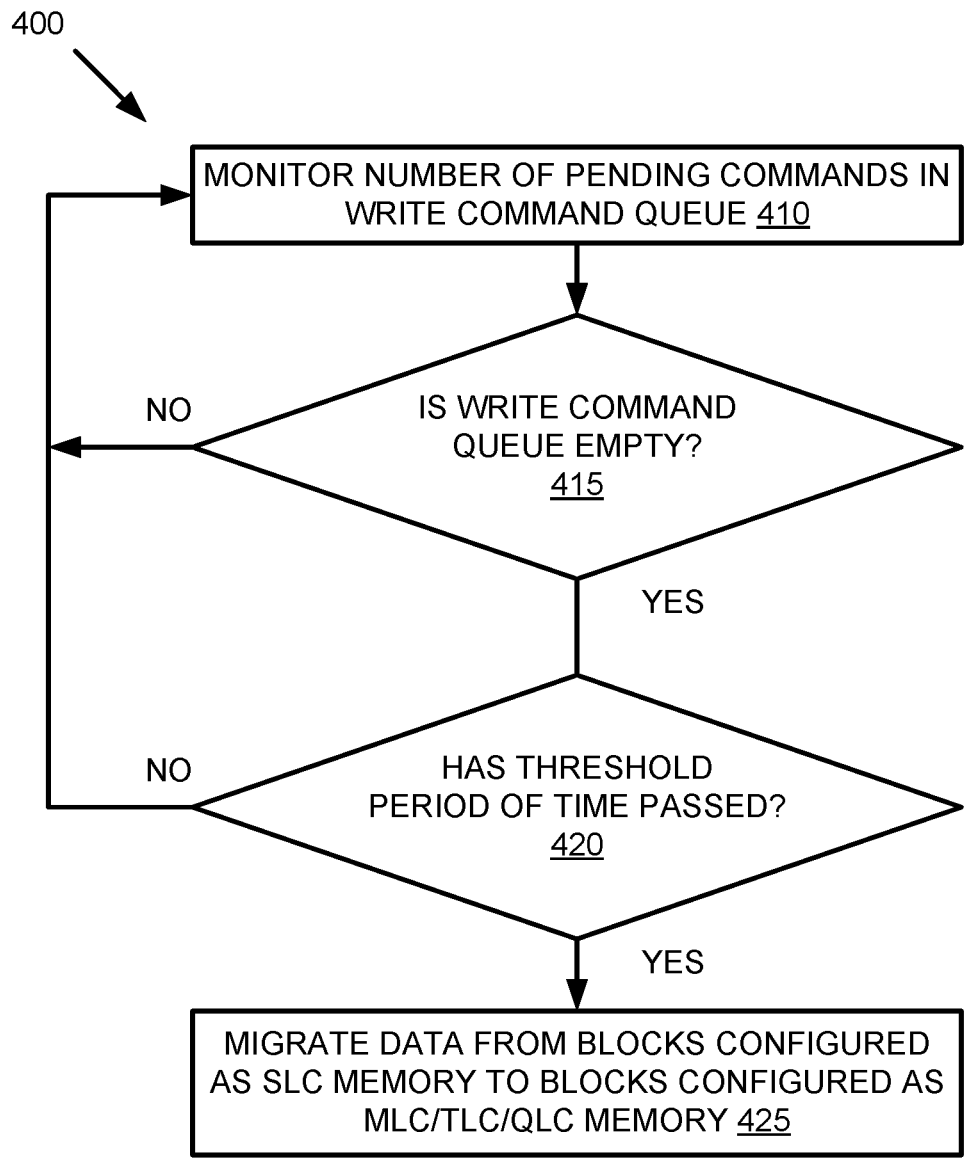
FIG. 4 is a flow diagram of an example method managing data written to memory using an on-demand high performance mode in accordance with some embodiments of the present disclosure.

FIG. 4 is a flow diagram of an example method managing data written to memory using an on-demand high performance mode in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by performance mode component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing device determines a number of pending host write commands 212 in write command queue 210. In one implementation, performance mode component 113 queries write command queue 210 to determine how many pending commands are stored in that queue. The number of pending commands may include commands stored in the queue but that have not yet been executed or that are scheduled for execution by performance mode component 113. In another implementation, performance mode component 113 maintains a counter for write command queue 210 that is incremented each time a command is added to the queue and decremented each time a command is executed from the queue. Accordingly, the value of this counter at any point in time will represent the number of pending host write commands 112 in the write command queue 210.

At block 415, the processing device determines whether write command queue 210 is empty. Write command queue 210 being empty can be indicative of all of the host write commands 212 having been executed. In one implementation, performance mode component 113 determines that write command queue 210 is empty if the number of pending host write commands determined at operation 410 is zero and determines that write command queue 210 is not empty if the number of pending host write commands determined at operation 410 is some number greater than zero.

If write command queue 210 is empty, at operation 420, the processing device determines whether a threshold amount of time has passed since write command queue 210 became empty. In one implementation, performance mode component 113 starts a counter/timer 250 upon determining that the write command queue 210 is empty at operation 415. In one implementation, a value of the counter/timer 250 starts at zero (or some other initial value) and increments at specific intervals until performance mode component 113 determines that the value has reached a threshold value corresponding to the threshold amount of time. In another implementation, the value of the counter/timer 250 starts at a value corresponding to the threshold amount of time and decrements at specific intervals until performance mode component 113 determines that the value has reached zero (or some other final value). The threshold amount of time can be programmable to suit any particular implementation and may be for example, zero milliseconds, 100 milliseconds, 500 milliseconds, or any other amount. In one implementation, performance mode component 113 interprets write command queue 210 being empty and the threshold amount of time having passed as an indication that host system 110 is idle.

Responsive to write command queue 210 being empty and the threshold amount of time having passed, at operation 425, the processing device migrates the data from a data block of memory component 112 configured as SLC memory (e.g., B1) to a data block of memory component 112 configured as MLC/TLC/QLC memory (e.g., B2). In one implementation, performance mode component 113 copies reads the data from the data block configured as SLC memory (e.g., B1) and writes that data to another data block configured as MLC/TLC/QLC memory (e.g., B2). The data block configured as MLC/TLC/QLC memory (e.g., B2) may be on the same or a different memory component in memory sub-system 110 as the data block configured as SLC memory (e.g., B1). In one implementation, after the data is written to the data block configured as MLC/TLC/QLC memory (e.g., B2), performance mode component 113 erases the data stored on the data block configured as SLC memory (e.g., B1).

Figure 5:
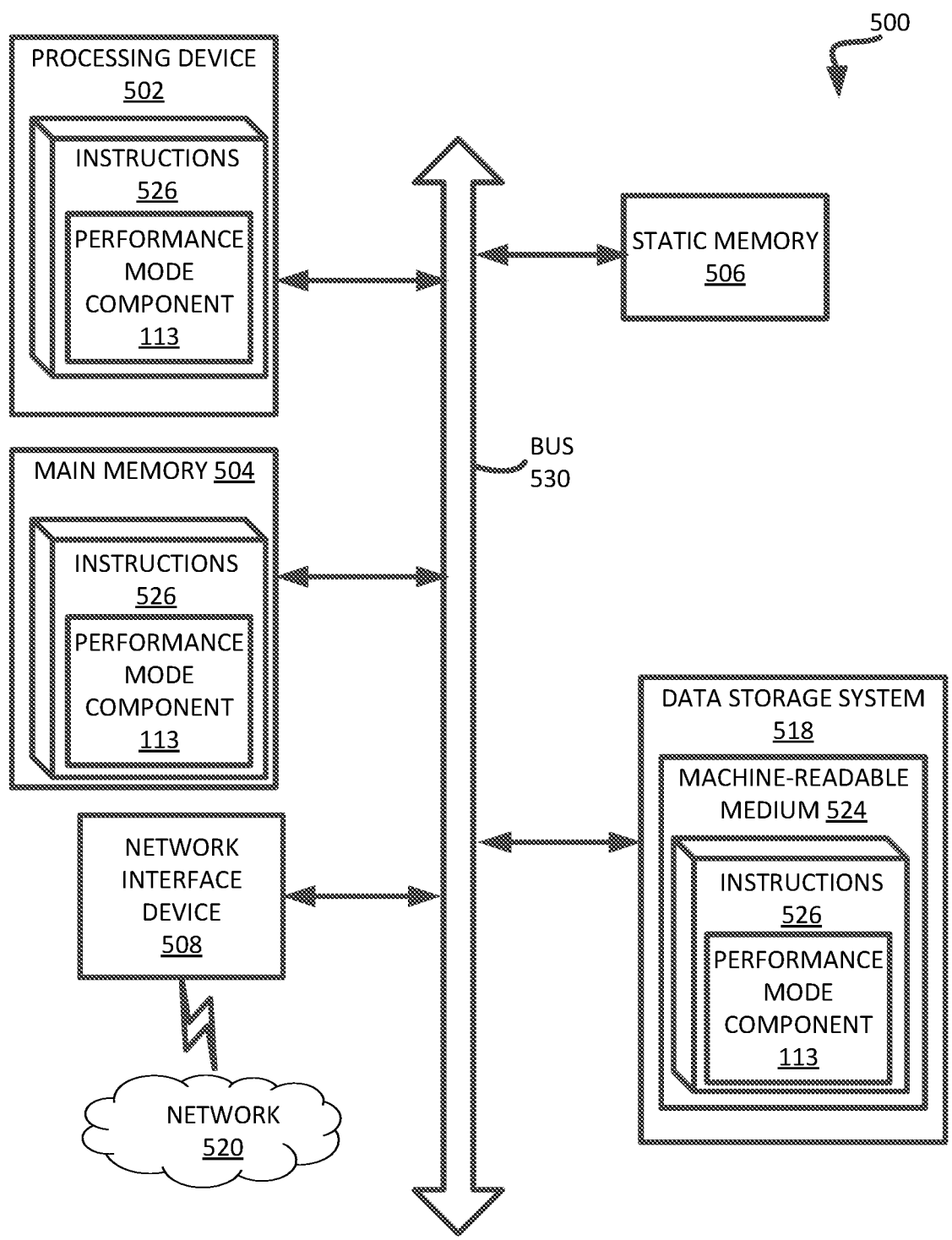
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to performance mode component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to performance mode component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
 determining whether a number of pending memory commands satisfies a threshold criterion;
 responsive to the number of pending memory commands satisfying the threshold criterion, initiating a first mode of operation for the system; and
 writing, in the first mode of operation, data corresponding to at least a subset of the number of pending memory commands to a first portion of the memory device.

2. The system of claim 1, wherein the number of pending memory commands satisfies the threshold criterion when the number of pending memory commands exceeds a threshold number.

3. The system of claim 1, wherein the pending memory commands comprise write commands.

4. The system of claim 1, wherein the first portion of the memory device comprises a first data block of the memory device configured as single-level-cell (SLC) memory.

5. The system of claim 1, wherein the processing device is to perform operations further comprising:
 receiving the memory commands from a host system coupled to the system; and
 storing the memory commands in a queue.

6. The system of claim 5, wherein the processing device is to perform operations further comprising:
 determining that the pending memory commands have been executed and that the queue has been empty for a threshold period of time; and
 migrating the data from the first portion of the memory device to a second portion of the memory device configured as multi-level-cell (MLC) memory.

7. The system of claim 1, wherein the processing device is to perform operations further comprising:
 responsive to the threshold criterion not being satisfied, initiating a second mode of operation for the system; and
 writing, in the second mode of operation, at least a subset of the number of pending memory commands to a third portion of the memory device.

8. The system of claim 7, wherein the third portion of the memory device comprises a third data block of the memory device configured as MLC memory.

9. A method comprising:
 determining whether a number of pending memory commands at a memory sub-system satisfies a threshold criterion;
 responsive to the threshold criterion being satisfied, initiating a first mode of operation for the memory sub-system; and
 writing, in the first mode of operation, data corresponding to at least a subset of the number of pending memory commands to a first portion of a memory device in the memory sub-system.

10. The method of claim 9, wherein the number of pending memory commands satisfies the threshold criterion when the number of pending memory commands exceeds a threshold number.

11. The method of claim 9, wherein the pending memory commands comprise write commands.

12. The method of claim 9, wherein the first portion of the memory device comprises a first data block of the memory device configured as single-level-cell (SLC) memory.

13. The method of claim 9, further comprising:
 receiving the memory commands from a host system coupled to the memory sub-system; and
 storing the memory commands in a queue.

14. The method of claim 13, further comprising:
 determining that the pending memory commands have been executed and that the queue has been empty for a threshold period of time; and
 migrating the data from the first portion of the memory device to a second portion of the memory device configured as multi-level-cell (MLC) memory.

15. The method of claim 9, further comprising:
 responsive to the threshold criterion not being satisfied, initiating a second mode of operation for the memory sub-system; and
 writing, in the second mode of operation, at least a subset of the number of pending memory commands to a third portion of the memory device.

16. The method of claim 15, wherein the third portion of the memory device comprises a third data block of the memory device configured as MLC memory.

17. A non-transitory computer-readable storage medium comprising instructions that, when executed by a processing device, cause the processing device to perform operations comprising:
 determining whether a number of pending memory commands at a memory sub-system satisfies a threshold criterion;
 responsive to the threshold criterion being satisfied, initiating a first mode of operation for the memory sub-system; and
 writing, in the first mode of operation, data corresponding to at least a subset of the number of pending memory commands to a first portion of a memory device in the memory sub-system.

18. The non-transitory computer-readable storage medium of claim 17, wherein the first portion of the memory device comprises a first data block of the memory device configured as single-level-cell (SLC) memory.

19. The non-transitory computer-readable storage medium of claim 18, wherein the instructions cause the processing device to perform operations further comprising
- determining that the pending memory commands have been executed and that a queue has been empty for a threshold period of time; and
- migrating the data from the first portion of the memory device to a second portion of the memory device configured as multi-level-cell (MLC) memory.

20. The non-transitory computer-readable storage medium of claim 17, wherein the instructions cause the processing device to perform operations further comprising:
- responsive to the threshold criterion not being satisfied, initiating a second mode of operation for the memory sub-system; and
- writing, in the second mode of operation, at least a subset of the number of pending memory commands to a third portion of the memory device configured as MLC memory.

\* \* \* \* \*